US012658858B2

(12) United States Patent
Imai

(10) Patent No.: US 12,658,858 B2
(45) Date of Patent: Jun. 16, 2026

(54) DOHERTY AMPLIFIER CIRCUIT

(71) Applicant: Murata Manufacturing Co., Ltd.,
Kyoto (JP)

(72) Inventor: Shohei Imai, Kyoto (JP)

(73) Assignee: Murata Manufacturing Co., Ltd.,
Kyoto (JP)

( * ) Notice: Subject to any disclaimer, the term of this
patent is extended or adjusted under 35
U.S.C. 154(b) by 461 days.

(21) Appl. No.: 18/484,660

(22) Filed: Oct. 11, 2023

(65) Prior Publication Data

US 2024/0128934 A1      Apr. 18, 2024

(30) Foreign Application Priority Data

Oct. 12, 2022      (JP) ................................. 2022-164017

(51) Int. Cl.
*H03F 1/02*          (2006.01)
*H03F 3/68*          (2006.01)
(52) U.S. Cl.
CPC ......... *H03F 1/0288* (2013.01); *H03F 1/0222*
(2013.01); *H03F 2200/451* (2013.01)

(58) Field of Classification Search
CPC ................. H03F 1/0288; H03F 1/0222; H03F
2200/451; H03F 2200/405; H03F 3/245;
H03F 1/32; H03F 3/19; H03F 3/211;
H03G 3/3042
USPC .............................................. 330/124 R, 295
See application file for complete search history.

(56) References Cited

U.S. PATENT DOCUMENTS

| | | | | |
|---|---|---|---|---|
| 11,152,895 | B2 * | 10/2021 | Scott | ..................... H03F 1/0288 |
| 2019/0149099 | A1 | 5/2019 | Lehtola | |
| 2023/0387861 | A1 * | 11/2023 | Maxim | ................... H03F 3/213 |

* cited by examiner

*Primary Examiner* — Hieu P Nguyen
(74) *Attorney, Agent, or Firm* — McDonald Hopkins LLC

(57) ABSTRACT
A Doherty amplifier circuit includes a carrier amplifier
including one or more amplifiers, and a peaking amplifier
including one or more amplifiers. At least one of the
amplifiers includes a first transistor and a current draw
circuit. The first transistor receives, at its base or gate, a first
radio frequency signal, and outputs, from its emitter or
source, a second radio frequency signal obtained by ampli-
fying the first radio frequency signal. The current draw
circuit draws, from the emitter or source of the first transis-
tor, a current based on a control signal.

8 Claims, 8 Drawing Sheets

DOHERTY AMPLIFIER CIRCUIT

CROSS REFERENCE TO RELATED APPLICATION

This application claims priority from Japanese Patent Application No. 2022-164017 filed on Oct. 12, 2022. The content of this application is incorporated herein by reference in its entirety.

BACKGROUND ART

The present disclosure relates to a Doherty amplifier circuit.

U.S. Patent Application Publication No. 2019/0149099 describes a Doherty amplifier circuit which changes the bias point of its peaking amplifier. Change of the bias point enables the gain of the peaking amplifier to be controlled.

When the bias point of a common-emitter amplifier is changed, its input impedance or its transmission phase characteristics may change to a large extent. The change of the characteristics of a common-emitter amplifier may affect the transmission phase characteristics of the carrier amplifier and those of the peaking amplifier of a related Doherty amplifier circuit. In a Doherty amplifier circuit, the relationship between the transmission phase characteristics of the carrier amplifier and those of the peaking amplifier is suitable. Desirably, the transmission phase characteristics of the carrier amplifier and those of the peaking amplifier do not change. Therefore, as a result of the change of the characteristics of a common-emitter amplifier, a related Doherty amplifier circuit may fail to obtain good characteristics (a radio-frequency output signal is distorted).

In a common-emitter amplifier, a bias circuit is often used to determine the bias point. A bias circuit, which is typically used, needs a high input voltage (in the order of about twice the threshold voltage ($V_{BE}$) of a transistor). It may be difficult to further add a signal for changing the bias point, to the signal having the high input voltage.

BRIEF SUMMARY

The present disclosure is made in view of the issue described above, and an object thereof is suppression of change of the characteristics.

A Doherty amplifier circuit according to an aspect of the present disclosure includes a carrier amplifier including one or more amplifiers, and a peaking amplifier including one or more amplifiers. At least one of the amplifiers includes a first transistor and a current draw circuit. The first transistor receives, at a base or gate thereof, a first radio frequency signal, and outputs, from an emitter or source thereof, a second radio frequency signal obtained by amplifying the first radio frequency signal. The current draw circuit draws, from the emitter or source of the first transistor, a current based on a control signal.

The present disclosure enables suppression of change of the characteristics.

DETAILED DESCRIPTION

Embodiments of the present disclosure will be described below in detail on the basis of the drawings. The embodiments do not limit the present disclosure. Needless to say, each embodiment is exemplary, and partial replacement or combination of configurations in different embodiments may be made. In a second embodiment and its subsequent embodiments, points common to those in a first embodiment will not be described, and only different points will be described. In particular, substantially the same operation and effect of substantially the same configuration will not be described in each embodiment.

First Embodiment

Configuration

Figure 1:
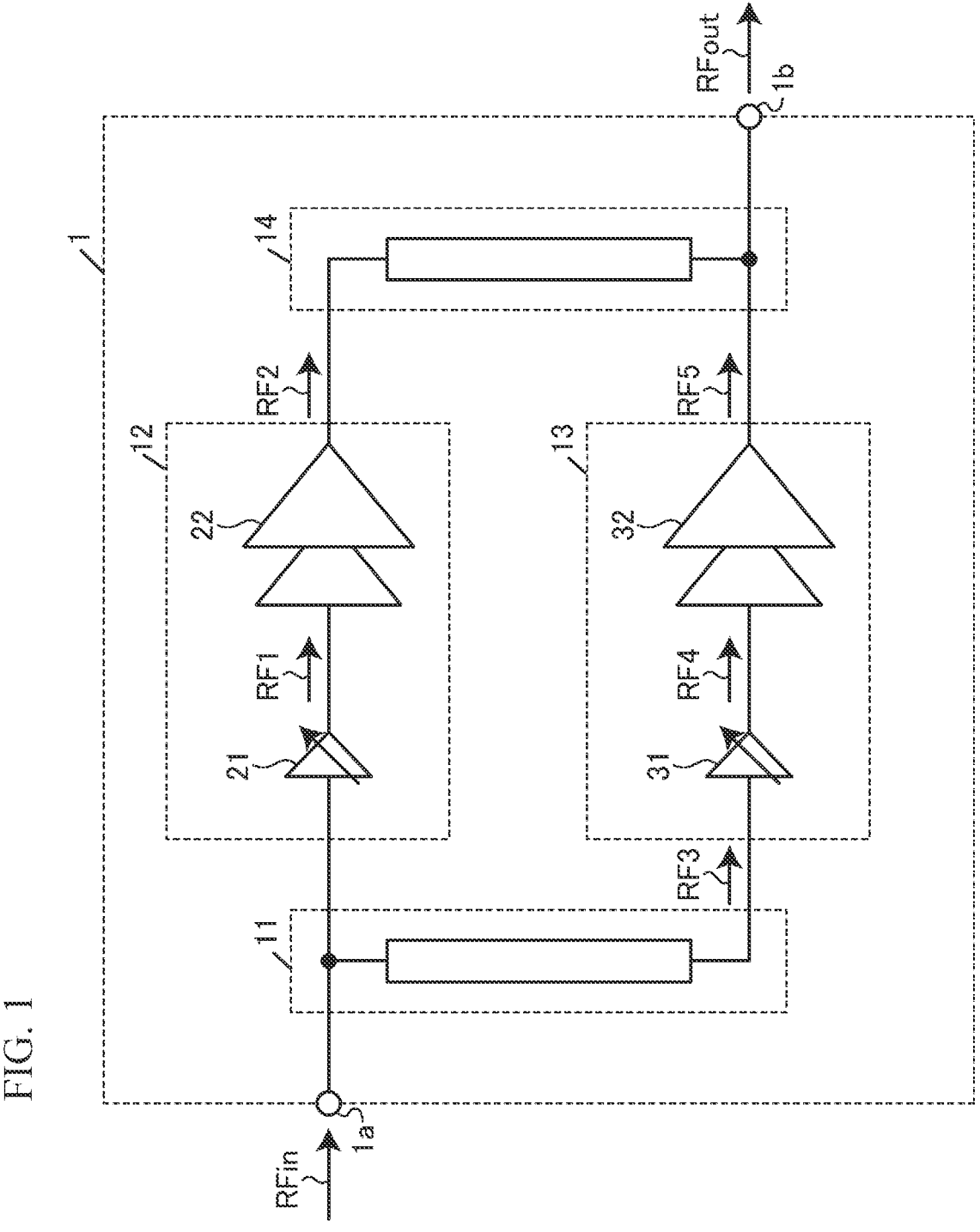
FIG. 1 is a diagram illustrating the configuration of a Doherty amplifier circuit according to a first embodiment.

FIG. 1 is a diagram illustrating the configuration of a Doherty amplifier circuit according to the first embodiment. A Doherty amplifier circuit 1 amplifies a radio frequency signal RFin, which is received at an input terminal 1a, and outputs a radio frequency signal RFout from an output terminal 1b.

The Doherty amplifier circuit 1 includes a divider 11, a carrier amplifier 12, a peaking amplifier 13, and a coupler 14.

The carrier amplifier 12 includes an upstream amplifier 21 and a downstream amplifier 22. The amplifier 21 is a variable-gain amplifier. The amplifier 22 is not a variable-gain amplifier.

The peaking amplifier 13 includes an upstream amplifier 31 and a downstream amplifier 32. The amplifier 31 is a variable-gain amplifier. The amplifier 32 is not a variable-gain amplifier.

The gain of amplifier 21 and that of the amplifier 31 are variable through change of their bias points.

In the first embodiment, each of the carrier amplifier 12 and the peaking amplifier 13 includes two amplifiers. However, the present disclosure is not limited to this. Each of the carrier amplifier 12 and the peaking amplifier 13 may include one amplifier or three or more amplifiers.

In the first embodiment, the upstream amplifiers 21 and 31 are variable-gain amplifiers. However, the present disclosure is not limited to this. The carrier amplifier 12 and the peaking amplifier 13 may have any configuration as long as at least one of the amplifiers included in the carrier amplifier 12 and the peaking amplifier 13 is a variable-gain amplifier.

The Doherty amplifier circuit 1 has good efficiency if the peaking amplifier 13 is operated at minimum required.

Therefore, at least one of the amplifiers included in the peaking amplifier 13 can be a variable-gain amplifier.

The efficiency of the amplifiers 21 and 31 is improved directly through change of their bias points. Control of the gain of the upstream amplifiers 21 and 31 causes a decrease of power consumption of the downstream amplifiers 22 and 32. That is, the efficiency of the downstream amplifiers 22 and 32 is improved indirectly through change of the bias points of the upstream amplifiers 21 and 31. If the bias points of the downstream amplifiers 22 and 32 may be changed, the efficiency of the downstream amplifiers 22 and 32 is improved directly.

The amplifier 21 outputs, to the amplifier 22, a radio frequency signal RF1 obtained by amplifying the radio frequency signal RFin. The amplifier 22 outputs, to the coupler 14, a radio frequency signal RF2 obtained by amplifying the radio frequency signal RF1.

The divider 11 outputs, to the amplifier 31, a radio frequency signal RF3 whose phase is different from that of the radio frequency signal RFin by approximately 90°. "Approximately 90°" encompasses, not only the phase of 90°, but also a phase of 90°±45°. For example, the divider 11 is a 90° hybrid circuit. However, the present disclosure is not limited to this.

The amplifier 31 outputs, to the amplifier 32, a radio frequency signal RF4 obtained by amplifying the radio frequency signal RF3. The amplifier 32 outputs, to the coupler 14, a radio frequency signal RF5 obtained by amplifying the radio frequency signal RF4.

The coupler 14 outputs, from the output terminal 1$b$ of the Doherty amplifier circuit 1, the radio frequency signal RFout obtained by combining the radio frequency signal RF2 and the radio frequency signal RF5.

Figure 2:
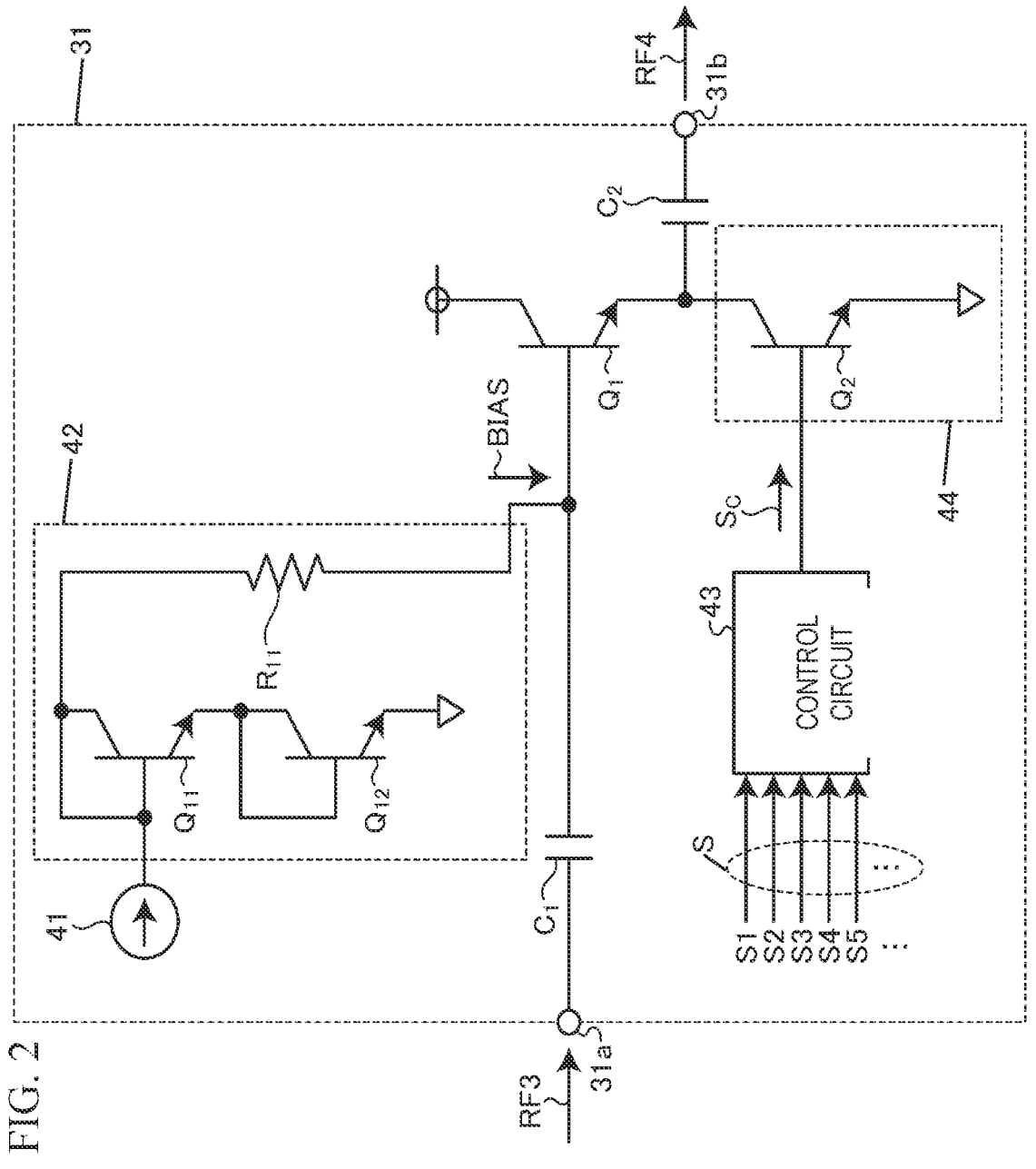
FIG. 2 is a diagram illustrating the configuration of a variable-gain amplifier in a Doherty amplifier circuit according to the first embodiment.

FIG. 2 is a diagram illustrating the configuration of a variable-gain amplifier in a Doherty amplifier circuit according to the first embodiment. FIG. 2 illustrates the configuration of the amplifier 31. The configuration of the amplifier 21 is substantially the same as that of the amplifier 31, and will be neither illustrated nor described.

The amplifier 31 amplifies the radio frequency signal RF3, which is received at an input terminal 31$a$, and outputs the radio frequency signal RF4 from an output terminal 31$b$.

The amplifier 31 includes a transistor $Q_1$, capacitors $C_1$ and $C_2$, a constant-current source 41, a bias circuit 42, a control circuit 43, and a current draw circuit 44.

In the first embodiment, each transistor is a bipolar transistor. However, the present disclosure is not limited to this. For example, the bipolar transistor is a heterojunction bipolar transistor (HBT). However, the present disclosure is not limited to this. The transistor may be, for example, a field effect transistor (FET). The transistor may be a multi-finger transistor in which multiple unit transistors are electrically coupled in parallel to each other. A unit transistor refers to the minimum configuration included in a transistor.

When each transistor is a FET, the drain of the FET corresponds to the collector of a bipolar transistor; the gate of the FET corresponds to the base of the bipolar transistor; the source of the FET corresponds to the emitter of the bipolar transistor.

The transistor $Q_1$ corresponds to an exemplary "first transistor" in the present disclosure.

The capacitor $C_1$ is electrically coupled, at its first end, to the input terminal 31$a$. The capacitor $C_1$ is electrically coupled, at its second end, to the base of the transistor $Q_1$. The capacitor $C_1$ is a DC-cut capacitor which cuts direct-current components of the radio frequency signal RF3.

The constant-current source 41 outputs a predetermined constant current to the bias circuit 42.

The bias circuit 42 includes transistors $Q_{11}$ and $Q_{12}$ and a resistor $R_{11}$.

The transistor $Q_{11}$ is electrically coupled, at its collector, to its base. That is, the transistor $Q_{11}$ is diode-connected. The transistor $Q_{11}$ receives, at its collector and its base, the constant current from the constant-current source 41.

The transistor $Q_{12}$ is electrically coupled, at its collector, to its base. That is, the transistor $Q_{12}$ is diode-connected. The transistor $Q_{12}$ is electrically coupled, at its collector and its base, to the emitter of the transistor $Q_{11}$.

The transistor $Q_{12}$ is electrically coupled, at its emitter, to a reference potential. For example, the reference potential is the ground potential. However, the present disclosure is not limited to this.

The transistors $Q_{11}$ and $Q_{12}$ generate a constant voltage (a voltage of two diodes).

The resistor $R_{11}$ is electrically coupled, at its first end, to the collector and the base of the transistor $Q_{11}$. The resistor $R_{11}$ is electrically coupled, at its second end, to the base of the transistor $Q_1$. The transistor $Q_1$ receives, at its base, a bias voltage or bias current BIAS from the second end of the resistor Rn.

The transistor $Q_1$ is supplied, at its collector, with the power supply voltage. That is, the transistor $Q_1$ is an emitter follower (common-collector) amplifier. The transistor $Q_1$ is electrically coupled, at its emitter, to a first end of the capacitor $C_2$. The capacitor $C_2$ is electrically coupled, at its second end, to the output terminal 31$b$. The transistor $Q_1$ amplifies the radio frequency signal RF3, which is received at its base, and outputs, from its emitter, the radio frequency signal RF4 through the capacitor $C_2$ to the output terminal 31$b$.

The control circuit 43 outputs a control signal $S_C$ to the current draw circuit 44 on the basis of a received signal S.

For example, the signal S includes signals S1 to S5. For example, the signal S1 is an envelope tracking signal which changes in accordance with the envelopes of the radio frequency signal RFin. For example, the signal S2 represents the power supply voltage supplied to the Doherty amplifier circuit 1. For example, the signal S3 represents the temperature of the Doherty amplifier circuit 1. For example, the signal S4 represents the saturation state of the carrier amplifier 12. For example, the signal S5 represents the reflection power of the Doherty amplifier circuit 1. However, the present disclosure is not limited to these.

The current draw circuit 44 includes a transistor $Q_2$.

The transistor $Q_2$ corresponds to an exemplary "second transistor" in the present disclosure.

The transistor $Q_2$ is electrically coupled, at its collector, to the emitter of the transistor $Q_1$ and the first end of the capacitor $C_2$. The transistor $Q_2$ receives, at its base, the control signal $S_C$. The transistor $Q_2$ is electrically coupled, at its emitter, to the reference potential.

In the transistor $Q_2$, a collector current flows in accordance with the control signal $S_C$. That is, the transistor $Q_2$ draws a current from the emitter of the transistor $Q_1$ in accordance with the control signal $S_C$. This makes the bias point of the transistor $Q_1$ variable and makes the gain of the transistor $Q_1$ variable.

Figure 3:
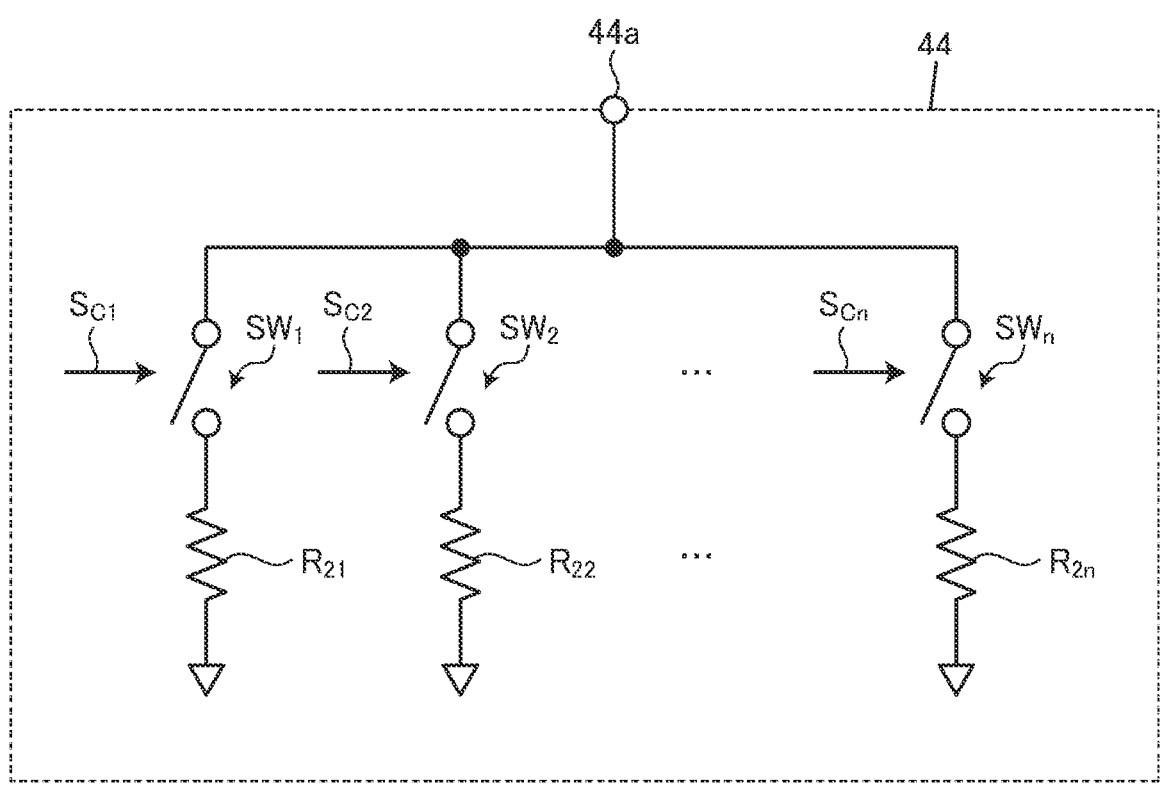
FIG. 3 is a diagram illustrating an exemplary current draw circuit of a Doherty amplifier circuit according to the first embodiment.

In the first embodiment, the current draw circuit 44 is constituted by the transistor $Q_2$ which draws an emitter current of the transistor $Q_1$. However, the present disclosure is not limited to this. The current draw circuit 44 may have any configuration as long as it is a circuit which is capable of drawing an emitter current of the transistor $Q_1$ in accordance with the control signal $S_C$. For example, as illustrated in FIG. 3, the current draw circuit 44 may employ resistors switched by using switches. The current draw circuit 44 has a terminal 44a electrically coupled to the emitter of the transistor $Q_1$. The current draw circuit 44, which is constituted by resistors switched by using switches, include multiple switches $SW_1$, $SW_2$, . . . , $SW_n$ (n is an integer greater than or equal to two), which are coupled in parallel to each other between the emitter of the transistor $Q_1$ and the reference potential, and multiple resistance elements $R_{21}$, $R_{22}$, . . . , $R_{2n}$, which are coupled in series to the respective switches $SW_1$, $SW_2$, . . . , $SW_n$, between the respective switches $SW_1$, $SW_2$, . . . , $SW_n$ and the reference potential. Such resistors switched by using switches enable digital control of the resistance values in accordance with control signals $S_{C1}$, $S_{C2}$, . . . , $S_{Cn}$, enabling control of an emitter current drawn from the transistor $Q_1$.

Effects (1)

In the transistor $Q_1$ which is an emitter follower amplifier, control of its bias point enables, not only gain control which is the main target, but also suppression of change of input impedance which is a problem in common-emitter amplifiers.

In common-emitter amplifiers, at the low bias point (OFF state), the input impedance is high; at the high bias point (ON state), the input impedance is low.

In contrast, in the transistor $Q_1$ which is an emitter follower amplifier, even at the high bias point (ON state), the input impedance is greater than or equal to several ten times the output impedance. Thus, the input impedance is kept high. That is, the transistor $Q_1$ has characteristics in which change of the bias point does not affect change of the input impedance and does not affect the distribution ratio of the divider 11 (see FIG. 1).

(2)

The amplifier 31 controls the emitter current of the transistor $Q_1$, which is an emitter follower amplifier, by using a draw current from the transistor $Q_2$. Thus, the amplifier 31 may decrease the voltage reference of the signal (control signal $S_C$) for controlling the emitter current of the transistor $Q_1$.

The draw current is the collector current of the transistor $Q_2$, and the control signal $S_C$ is received at the base of the transistor $Q_2$. At that time, the base voltage (control signal $S_C$) of the transistor $Q_2$ slightly rises and falls around the threshold voltage ($V_{BE}$) of the transistor $Q_2$, while adapting to the conditions (such as the radio-frequency input signal, the power supply voltage, the temperature, the saturation state, and the reflection power) which change with time. That is, the maximum voltage required by the control signal $S_C$ is small, enabling application even under the limitation of the power supply voltage having a strict requirement in a portable device typified by a cellular phone device.

If a circuit equivalent to the amplifier 31 is implemented by using a common-emitter amplifier and a bias circuit, it is difficult to achieve compatibility between operation under the limitation of the power supply voltage and fast operation.

(3)

In the transistor $Q_1$ which is an emitter follower amplifier, the voltage amplification factor is ideally one, and the phase of the radio frequency signal RF3 is the same as that of the radio frequency signal RF4. That is, the transistor $Q_1$ achieves suppression of change, due to the output power, of the voltage amplitude between the input/output terminals (between the base and the emitter of the transistor $Q_1$).

As a result, even when a parasitic capacitance, which changes in accordance with the voltage, is present between the input/output terminals (between the base and the emitter) of the transistor $Q_1$, the dependency of the parasitic capacitance with respect to the output power is suppressed, and the change of the phase of the output signal is suppressed. Thus, the Doherty amplifier circuit 1 achieves suppression of distortion of the radio frequency signal RFout.

Figure 4:
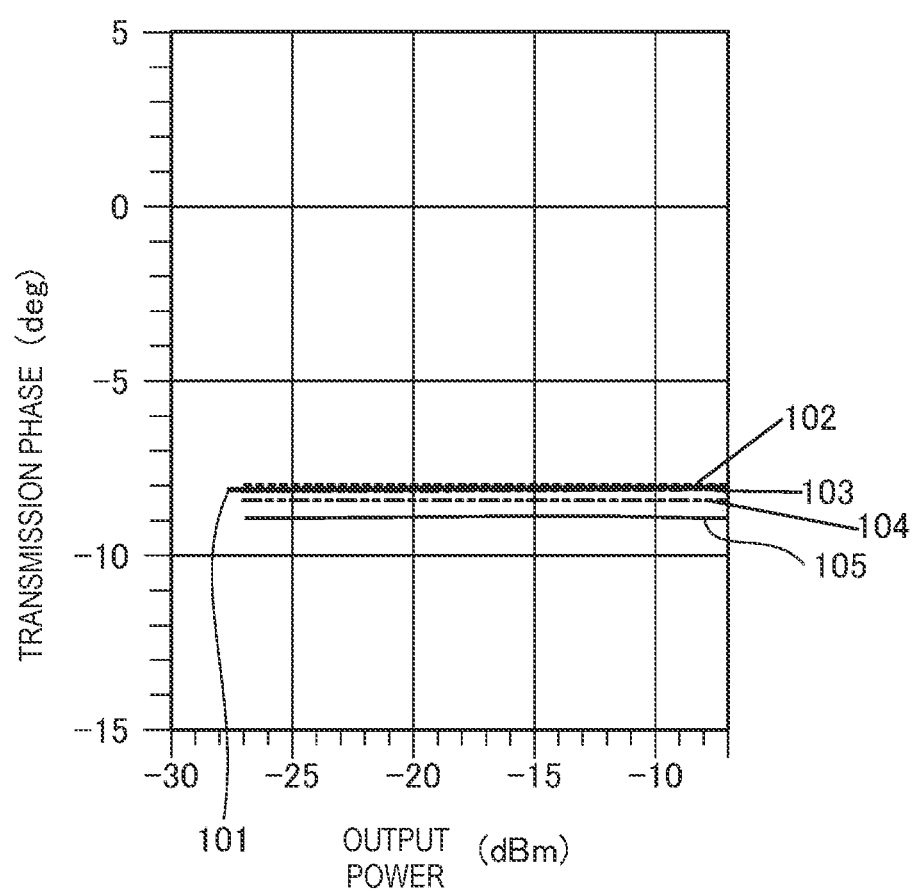
FIG. 4 is a diagram illustrating circuit simulation results of a variable-gain amplifier according to the first embodiment.

FIG. 4 is a diagram illustrating circuit simulation results of a variable-gain amplifier according to the first embodiment. In FIG. 4, the vertical axis represents transmission phase (deg); the horizontal axis represents output power (dBm).

Line 101 indicates the relationship between transmission phase and output power when the control signal $S_C$=0.1 milliampere (mA). Line 102 indicates the relationship between transmission phase and output power when the control signal $S_C$=0.2 mA. Line 103 indicates the relationship between transmission phase and output power when the control signal $S_C$=0.3 mA. Line 104 indicates the relationship between transmission phase and output power when the control signal $S_C$=0.4 mA. Line 105 indicates the relationship between transmission phase and output power when the control signal $S_C$=0.5 mA.

As illustrated by using lines 101 to 105, the transmission phase hardly changes even when the output power changes. The transmission phase has almost no difference even when the control signal $S_C$ is different.

(4)

If a resistor is inserted between the emitter of the transistor $Q_2$ and the reference potential, a risk of damage from an overcurrent may be reduced.

For example, the transistor $Q_2$ may receive, at its base, application of a high voltage which has not been limited. As a result, a large voltage applied between the base and the emitter of the transistor $Q_2$ may cause flow of a large current between the collector and the emitter, resulting in a terrible damage to the transistor $Q_2$.

However, if a resistor is inserted between the emitter of the transistor $Q_2$ and the reference potential, the resistor generates a voltage drop when a large voltage is applied to the base of the transistor $Q_2$ and a current flows through the collector. This increases the emitter potential of the transistor $Q_2$. As a result, application of a large voltage between the base and the emitter of the transistor $Q_2$ is suppressed, resulting in suppression of a terrible damage to the transistor $Q_2$.

Second Embodiment

Among the components in the second embodiment, the same components as those in the first embodiment are designated with the same reference numerals, and will not be described.

Configuration

Figure 5:
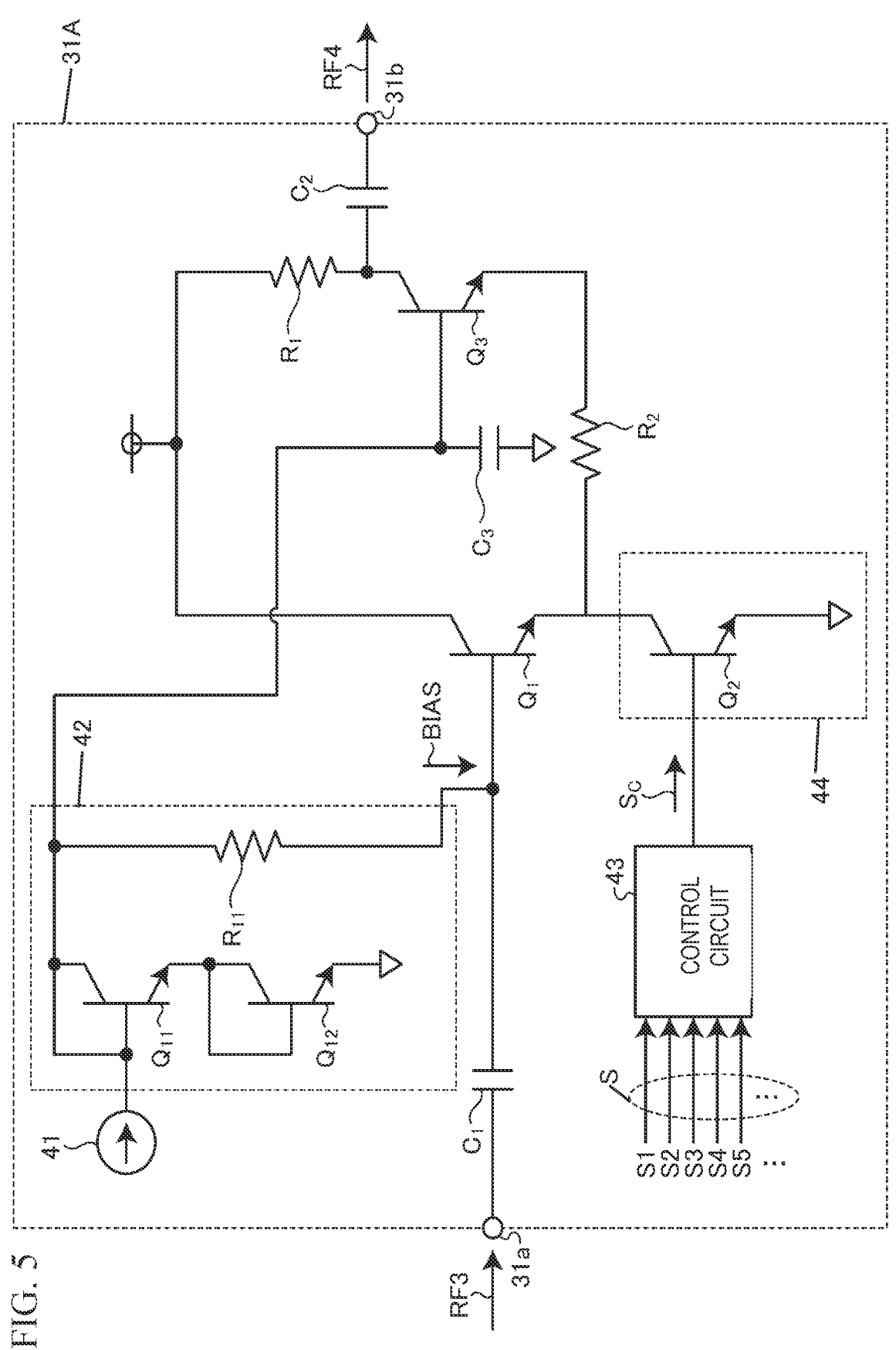
FIG. 5 is a diagram illustrating the configuration of a variable-gain amplifier according to a second embodiment.

FIG. 5 is a diagram illustrating the configuration of a variable-gain amplifier according to the second embodiment.

Compared with the amplifier 31 (see FIG. 2), an amplifier 31A further includes a transistor $Q_3$, a capacitor $C_3$, and resistors $R_1$ and $R_2$.

The transistor $Q_3$ corresponds to an exemplary "third transistor" in the present disclosure.

The resistor $R_1$ is electrically coupled, at its first end, to the power supply potential. The resistor $R_1$ is electrically coupled, at its second end, to the collector of the transistor $Q_3$ and the first end of the capacitor $C_2$.

The resistor $R_2$ is electrically coupled, at its first end, to the emitter of the transistor $Q_1$ and the collector of the transistor $Q_2$. The resistor $R_2$ is electrically coupled, at its second end, to the emitter of the transistor $Q_3$.

The transistor $Q_3$ is electrically coupled, at its base, to a first end of the capacitor $C_3$. The capacitor $C_3$ is electrically coupled, at its second end, to the reference potential. That is, the transistor $Q_3$ is a common-base amplifier. The transistor $Q_3$ is electrically coupled, at its base, to the collector and the base of the transistor $Q_{11}$, and is supplied with the voltage at the collector and the base of the transistor $Q_{11}$.

The transistor $Q_3$ amplifies the radio frequency signal, which is output by the transistor $Q_1$, and outputs the amplified radio frequency signal from its collector.

The voltage at the collector and the base of the transistor $Q_{11}$ is shared by the base of the transistor $Q_1$ and the base of the transistor $Q_3$. The current draw circuit 44 is shared by the emitter of the transistor $Q_1$ and the emitter of the transistor $Q_3$.

Effects (1)

In the amplifier 31 (see FIG. 2) according to the first embodiment, the amplifier transistor whose gain is controlled is a single transistor, that is, the transistor $Q_1$ which is an emitter follower amplifier. The transistor $Q_1$, which is an emitter follower amplifier, does not amplify the voltage (the voltage amplification factor=1). Therefore, the amplifier 31 has a narrow range in which the gain may be controlled.

In contrast, the amplifier 31A, which has the transistor $Q_3$, may amplify the voltage, achieving enlargement of the gain control range.

Figure 6:
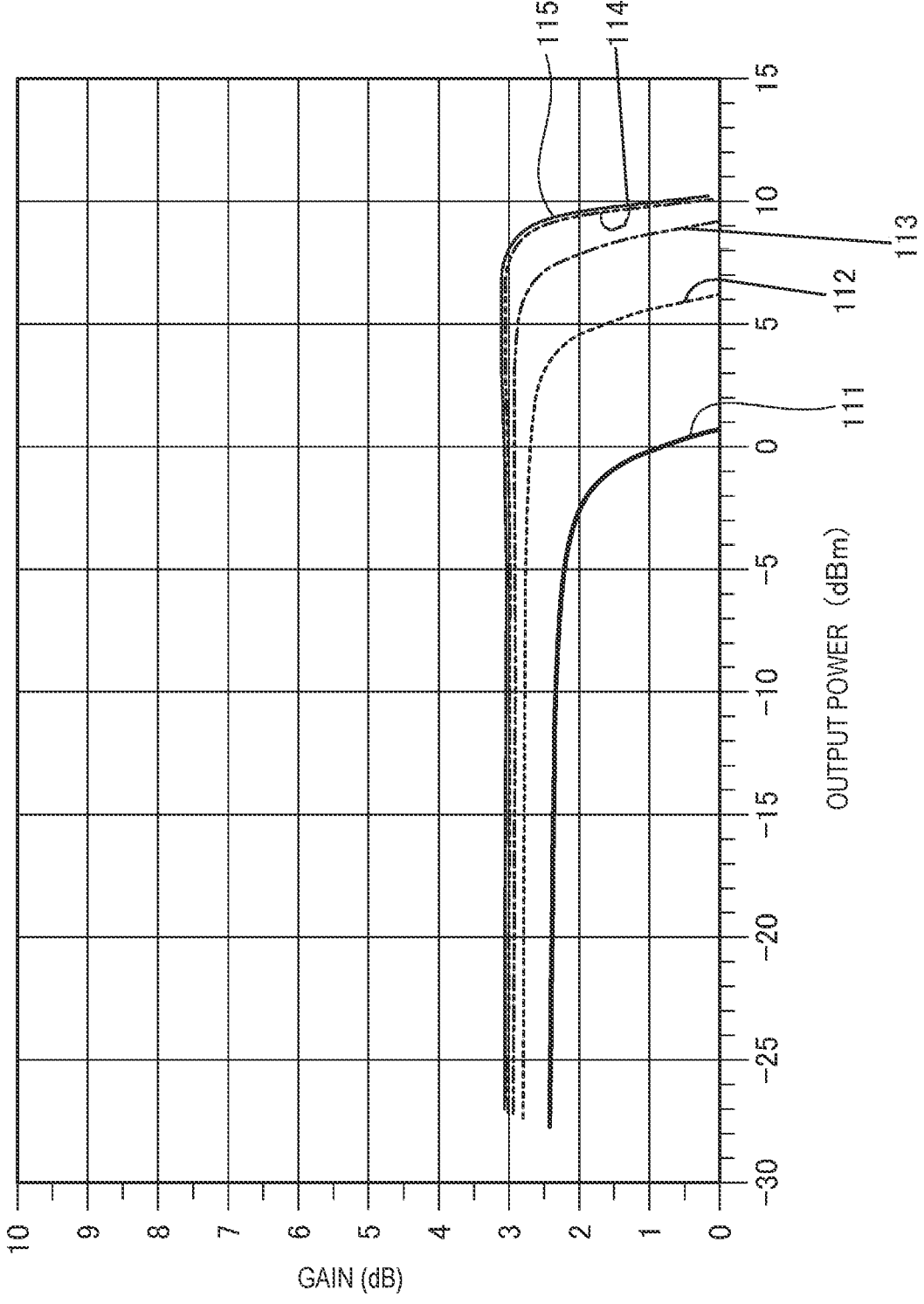
FIG. 6 is a diagram illustrating circuit simulation results of a variable-gain amplifier according to the first embodiment.

FIG. 6 is a diagram illustrating circuit simulation results of a variable-gain amplifier according to the first embodiment. In FIG. 6, the vertical axis represents gain (dB); the horizontal axis represents output power (dBm).

Line 111 indicates the relationship between gain and output power when the control signal $S_C$=0.1 mA. Line 112 indicates the relationship between gain and output power when the control signal $S_C$=0.2 mA. Line 113 indicates the relationship between gain and output power when the control signal $S_C$=0.3 mA. Line 114 indicates the relationship between gain and output power when the control signal $S_C$=0.4 mA. Line 115 indicates the relationship between gain and output power when the control signal $S_C$=0.5 mA.

As illustrated in FIG. 6, in the amplifier 31, even the case in which the range in which the gain is variable is less than 1 dB is present.

Figure 7:
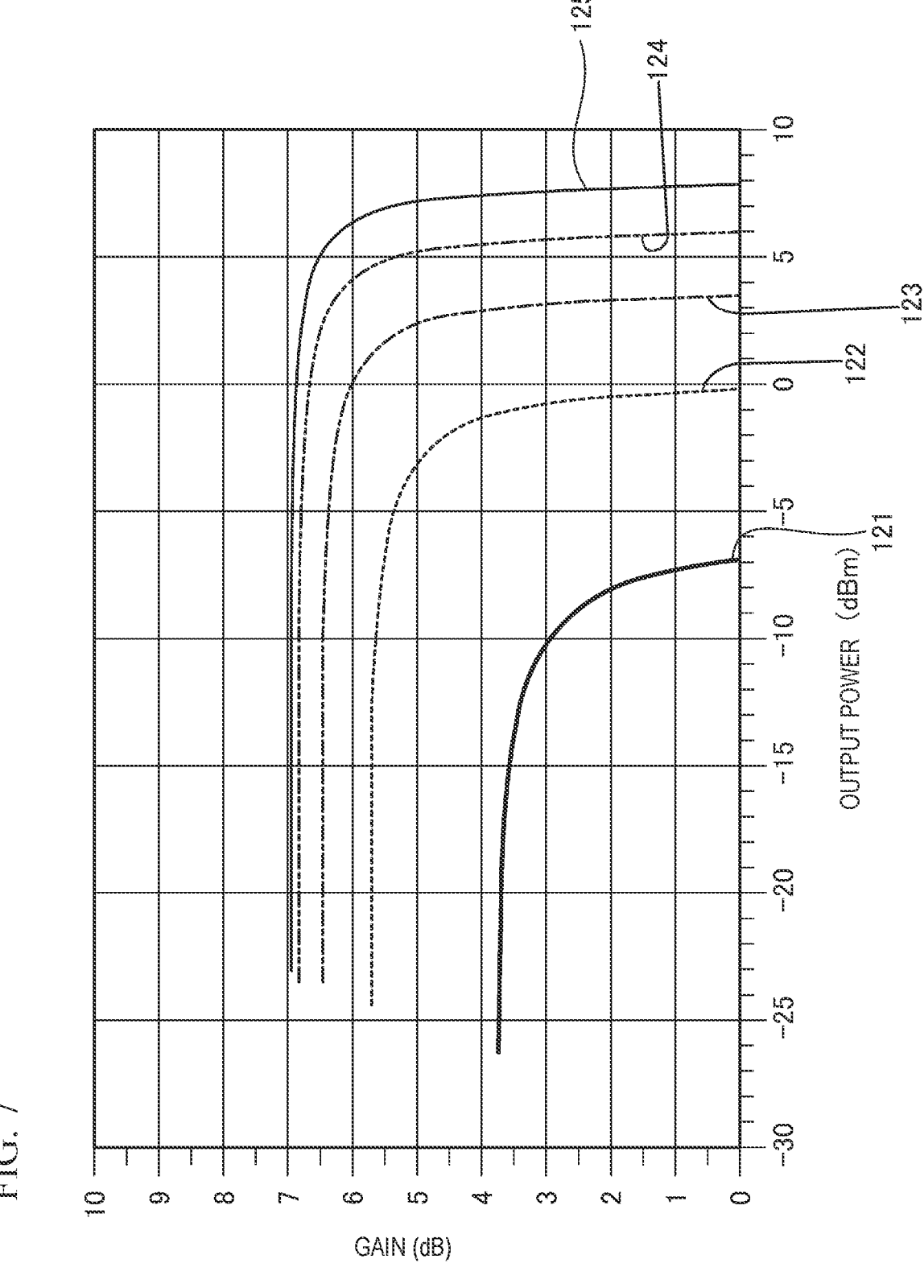
FIG. 7 is a diagram illustrating circuit simulation results of a variable-gain amplifier according to the second embodiment.

FIG. 7 is a diagram illustrating circuit simulation results of a variable-gain amplifier according to the second embodiment. In FIG. 7, the vertical axis represents gain (dB); the horizontal axis represents output power (dBm).

Line 121 indicates the relationship between gain and output power when the control signal $S_C$=0.1 mA. Line 122 indicates the relationship between gain and output power when the control signal $S_C$=0.2 mA. Line 123 indicates the relationship between gain and output power when the control signal $S_C$=0.3 mA. Line 124 indicates the relationship between gain and output power when the control signal $S_C$=0.4 mA. Line 125 indicates the relationship between gain and output power when the control signal $S_C$=0.5 mA.

As illustrated in FIG. 7, compared with the amplifier 31, the amplifier 31A achieves enlargement of the range in which the gain is variable.

The transistor $Q_1$ and the transistor $Q_3$ share the bias circuit 42 and the current draw circuit 44. Therefore, the amplifier 31A achieves suppression of an increase of circuit components.

8

(2)

When the transistor $Q_3$ is a bipolar transistor, the effects described below are produced.

In a common-base amplifier, direct joint between the input/output terminals (between the emitter and the collector) is not present in view of the semiconductor element structure, and its parasitic capacitance is extremely small. Therefore, the dependency of transmission phase with respect to output power is small, which is excellent compared with an emitter connection amplifier.

Figure 8:
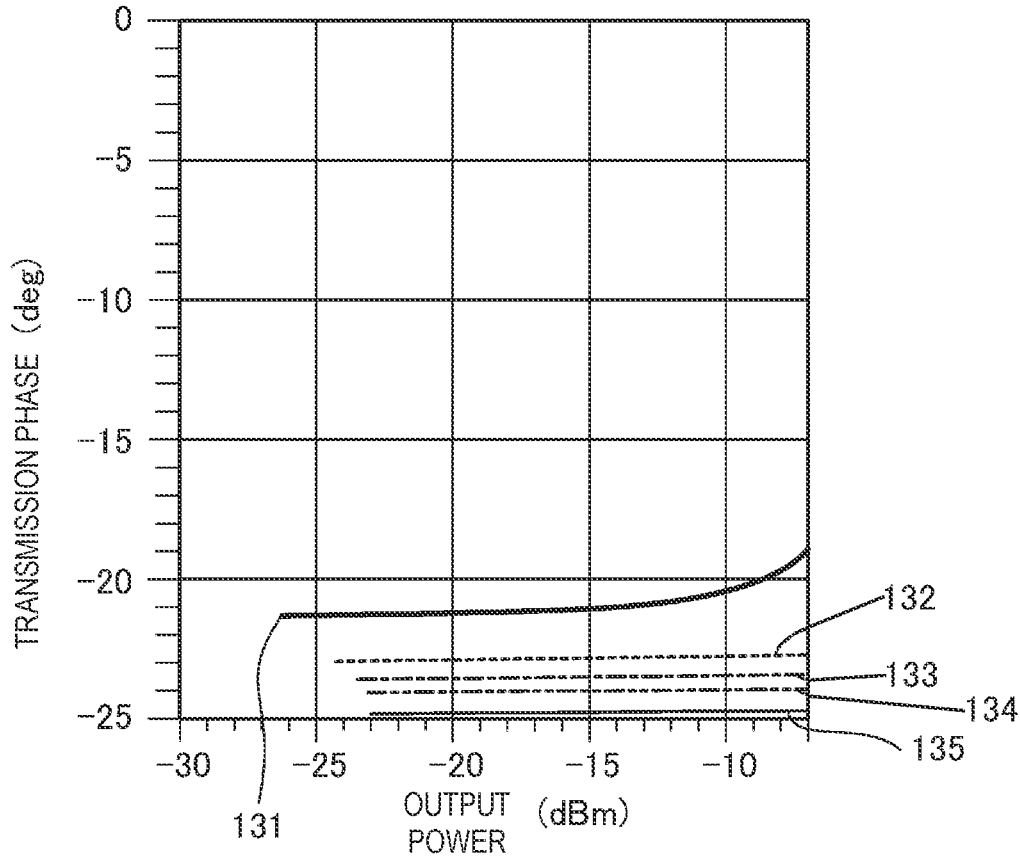
FIG. 8 is a diagram illustrating circuit simulation results of a variable-gain amplifier according to the second embodiment.

FIG. 8 is a diagram illustrating circuit simulation results of a variable-gain amplifier according to the second embodiment. In FIG. 8, the vertical axis represents transmission phase (deg); the horizontal axis represents output power (dBm).

Line 131 indicates the relationship between transmission phase and output power when the control signal $S_C$=0.1 mA. Line 132 indicates the relationship between transmission phase and output power when the control signal $S_C$=0.2 mA. Line 133 indicates the relationship between transmission phase and output power when the control signal $S_C$=0.3 mA. Line 134 indicates the relationship between transmission phase and output power when the control signal $S_C$=0.4 mA. Line 135 indicates the relationship between transmission phase and output power when the control signal $S_C$=0.5 mA.

As illustrated in FIG. 8, in the amplifier 31A, only a phase change of several degrees occurs even when the output power changes. In the amplifier 31A, only a phase change of several degrees occurs even when the control signal $S_C$ changes.

Thus, the amplifier 31A enables control of the gain while suppressing the phase change.

Configuration Examples of the Present Disclosure

The present disclosure may employ the configurations described below.

(1)

A Doherty amplifier circuit comprising:
a carrier amplifier including one or more amplifiers; and
a peaking amplifier including one or more amplifiers,
wherein at least one of the amplifiers includes
a first transistor that receives, at a base or gate thereof, a first radio frequency signal, and that outputs, from an emitter or source thereof, a second radio frequency signal obtained by amplifying the first radio frequency signal, and
a current draw circuit that draws, from the emitter or source of the first transistor, a current based on a control signal.

(2)

The Doherty amplifier circuit according to (1),
wherein the current draw circuit includes a second transistor that is electrically coupled, at a collector or drain thereof, to the emitter of the first transistor, that receives, at a base or gate thereof, the control signal, and that is electrically coupled, at an emitter or source thereof, to a reference potential.

(3)

The Doherty amplifier circuit according to (1) or (2), further comprising:
a third transistor that is electrically coupled, at an emitter or source thereof, to the emitter of the first transistor and the current draw circuit, that is AC-grounded at a base or gate thereof, and that outputs, from a collector or drain thereof, a third radio frequency signal obtained by amplifying the second radio frequency signal.

(4)

The Doherty amplifier circuit according to any one of (1) to (3), wherein the control signal changes based on at least one of an envelope of a radio frequency signal, a power supply voltage, a temperature, a saturation state of the carrier amplifier, and reflection power.

The embodiments described above are made for easy understanding of the present disclosure, not for limited interpretation of the present disclosure. The present disclosure may be changed/improved without necessarily departing from its gist. The present disclosure encompasses its equivalents.

What is claimed is:

1. A Doherty amplifier circuit comprising:

a carrier amplifier comprising one or more first amplifiers; and a peaking amplifier comprising one or more second amplifiers, wherein at least one of the first or second amplifiers comprises:

a first transistor that receives a first radio frequency signal at a base or a gate of the first transistor, and that outputs a second radio frequency signal obtained by amplifying the first radio frequency signal from an emitter or a source of the first transistor, and a current draw circuit that is configured to draw a current from the emitter or the source of the first transistor, based on a control signal.

2. The Doherty amplifier circuit according to claim 1, wherein the current draw circuit comprises a second transistor, wherein a collector or a drain of the second transistor is electrically coupled to the emitter or the source of the first transistor, and wherein an emitter or a source of the second transistor is electrically coupled to a reference potential.

3. The Doherty amplifier circuit according to claim 1, further comprising:

a third transistor, wherein an emitter or a source of the third transistor is electrically coupled to the emitter or the source of the first transistor and to the current draw circuit, wherein a base or a gate of the third transistor is AC-grounded, and wherein a collector or a drain of the third transistor outputs a third radio frequency signal obtained by amplifying the second radio frequency signal.

4. The Doherty amplifier circuit according to claim 1, wherein the control signal changes based on an envelope of a radio frequency signal of the Doherty amplifier circuit.

5. The Doherty amplifier circuit according to claim 1, wherein the control signal changes based on a power supply voltage supplied to the Doherty amplifier circuit.

6. The Doherty amplifier circuit according to claim 1, wherein the control signal changes based on a temperature of the Doherty amplifier circuit.

7. The Doherty amplifier circuit according to claim 1, wherein the control signal changes based on a saturation state of the carrier amplifier.

8. The Doherty amplifier circuit according to claim 1, wherein the control signal changes based on a reflection power of the Doherty amplifier circuit.

* * * * *